United States Patent
Yun et al.

(10) Patent No.: US 10,103,703 B2
(45) Date of Patent: Oct. 16, 2018

(54) DOUBLE-SIDED CIRCUIT

(71) Applicant: QUALCOMM Incorporated, San Diego, CA (US)

(72) Inventors: Changhan Hobie Yun, San Diego, CA (US); David Francis Berdy, San Diego, CA (US); Chengjie Zuo, San Diego, CA (US); Daeik Daniel Kim, Del Mar, CA (US); Jonghae Kim, San Diego, CA (US); Mario Francisco Velez, San Diego, CA (US); Niranjan Sunil Mudakatte, San Diego, CA (US); Robert Paul Mikulka, Oceanside, CA (US)

(73) Assignee: QUALCOMM Incorporated, San Diego, CA (US)

( * ) Notice: Subject to any disclaimer, the term of this patent is extended or adjusted under 35 U.S.C. 154(b) by 145 days.

(21) Appl. No.: 15/161,138

(22) Filed: May 20, 2016

(65) Prior Publication Data

US 2017/0338788 A1    Nov. 23, 2017

(51) Int. Cl.
*H03H 7/01*    (2006.01)
*H01F 5/00*    (2006.01)
(Continued)

(52) U.S. Cl.
CPC .......... *H03H 7/0115* (2013.01); *H01F 5/003* (2013.01); *H01F 41/04* (2013.01); *H01F 41/041* (2013.01); *H01P 1/203* (2013.01); *H01P 1/2135* (2013.01); *H01P 5/12* (2013.01); *H03H 1/00* (2013.01); *H03H 7/09* (2013.01); *H03H 7/1758* (2013.01); *H03H 7/1766* (2013.01); *H03H 7/1775* (2013.01); *H03H 7/463* (2013.01); *H05K 1/0237* (2013.01); *H05K 1/0306* (2013.01); *H05K 1/115* (2013.01); *H05K 1/162* (2013.01); *H05K 1/165* (2013.01); *H05K 1/186* (2013.01); *H05K 3/0026* (2013.01); *H05K 3/18* (2013.01);
(Continued)

(58) Field of Classification Search
CPC ......... H03H 7/0115; H03H 2001/0085; H03H 7/1775; H03H 7/1766
USPC .................................................. 333/175, 185
See application file for complete search history.

(56) References Cited

U.S. PATENT DOCUMENTS 4,881,050 A * 11/1989 Swanson, Jr. ........ H03H 7/0115
                                                                333/168
7,924,116 B2    4/2011 Ono et al.
(Continued)

FOREIGN PATENT DOCUMENTS

EP    1160972 A2    12/2001

OTHER PUBLICATIONS

International Search Report and Written Opinion—PCT/US2017/028851—ISA/EPO—dated Aug. 28, 2017.

*Primary Examiner* — Rakesh Patel
(74) *Attorney, Agent, or Firm* — Muncy, Geissler, Olds & Lowe, P.C.

(57) ABSTRACT

The present disclosure provides circuits and methods for fabricating circuits. A circuit may include an insulator having a first surface, a second surface, a periphery, a first subset of circuit elements disposed on the first surface, a second subset of circuit elements disposed on the second surface, and at least one conductive sidewall disposed on the periphery, wherein the conductive sidewall electrically couples the first subset of circuit elements to the second subset of circuit elements.

20 Claims, 8 Drawing Sheets

(51) Int. Cl.
*H01F 41/04* (2006.01)
*H01P 1/203* (2006.01)
*H03H 7/09* (2006.01)
*H05K 1/18* (2006.01)
*H03H 1/00* (2006.01)
*H05K 1/02* (2006.01)
*H05K 1/03* (2006.01)
*H05K 1/11* (2006.01)
*H05K 1/16* (2006.01)
*H05K 3/00* (2006.01)
*H05K 3/18* (2006.01)
*H05K 3/40* (2006.01)
*H01P 1/213* (2006.01)
*H01P 5/12* (2006.01)
*H03H 7/46* (2006.01)

(52) U.S. Cl.
CPC ... *H05K 3/4038* (2013.01); *H03H 2001/0078* (2013.01)

(56) References Cited

U.S. PATENT DOCUMENTS

| | | |
|---|---|---|
| 9,203,373 B2 | 12/2015 | Zuo et al. |
| 2003/0076199 A1* | 4/2003 | Yamaguchi ......... H01P 1/20372 333/175 |
| 2004/0124949 A1 | 7/2004 | Anthony et al. |
| 2005/0068148 A1* | 3/2005 | Yoshida ............. H01F 17/0013 336/200 |
| 2007/0013462 A1* | 1/2007 | Fan ...................... H03H 7/0115 333/185 |
| 2007/0176727 A1 | 8/2007 | Chen et al. |
| 2011/0090665 A1 | 4/2011 | Korony et al. |
| 2013/0285765 A1 | 10/2013 | Subedi |
| 2014/0327496 A1 | 11/2014 | Zuo et al. |
| 2015/0035162 A1 | 2/2015 | Lan et al. |
| 2015/0303890 A1* | 10/2015 | Taniguchi ............. H03H 7/075 333/185 |

* cited by examiner

DOUBLE-SIDED CIRCUIT

INTRODUCTION

Aspects of this disclosure relate generally to wireless communication devices, and more particularly to double-sided circuits.

Wireless communication devices conventionally include a large number of circuits, including, for example, one or more multiplexers. Generally, multiplexers may separate an incoming signal or an outgoing signal into a plurality of distinct frequency bands. For example, a wireless communication device may include a multiplexer that separates an incoming signal or an outgoing signal into two bands associated with different bandwidths. The different bandwidths may be respectively centered on, for example, a first frequency and a second frequency, wherein the first frequency is higher than the second frequency. These bandwidths may be referred to as a high-frequency band and a low-frequency band, respectively.

Each circuit may include passive components, for example, capacitors and inductors. In a multiplexer, for example, the passive components may be configured to separate the incoming signal or the outgoing signal into high-frequency components (i.e., signal components within the high-frequency band) and low-frequency components (i.e., signal components within the low-frequency band). A wireless communication device may include a plurality of multiplexers, for example, a first multiplexer for wireless local area network (WLAN) connectivity (for example, in accordance with a Wi-Fi connection protocol) and a second multiplexer for wireless wide area network (WWAN) connectivity (for example, in accordance with a Long-Term Evolution, or LTE connection protocol).

There is a need in the field of wireless communication devices for smaller circuits, especially multiplexers, which tend to have large passive components (such as, for example, inductors).

There is also a need to improve the performance of the circuits. For example, in some existing multiplexer arrangements, the relative proximity of two inductors may cause cross-talk, thereby distorting the signal as it passes through the multiplexer.

SUMMARY

In one aspect, the present disclosure provides a circuit apparatus. The circuit apparatus may include an insulator having a first surface, a second surface, and a periphery, a first subset of circuit elements disposed on the first surface, a second subset of circuit elements disposed on the second surface, and at least one conductive sidewall disposed on the periphery, wherein the conductive sidewall electrically couples the first subset of circuit elements to the second subset of circuit elements.

In another aspect, the present disclosure provides a method of manufacturing a circuit apparatus. The method may include providing an insulator having a first surface, a second surface, and a periphery, disposing a first subset of circuit elements on the first surface, disposing a second subset of circuit elements on the second surface, and disposing at least one conductive sidewall on the periphery, wherein the conductive sidewall electrically couples the first subset of circuit elements to the second subset of circuit elements.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the invention, and in which.

DETAILED DESCRIPTION

Aspects of the disclosure are disclosed in the following description and related drawings directed to specific aspects of the disclosure. Alternate aspects may be devised without departing from the scope of the invention. Additionally, well-known elements of the invention will not be described in detail or will be omitted so as not to obscure the relevant details of the invention.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the invention" does not require that all aspects of the invention include the discussed feature, advantage, or mode of operation.

As used herein, the term "vertical" is generally defined with respect to a surface of a substrate or carrier upon which a semiconductor package is formed. The substrate or carrier will generally define a "horizontal" plane, and a vertical direction approximates a direction that is roughly orthogonal to the horizontal plane.

Figure 1:
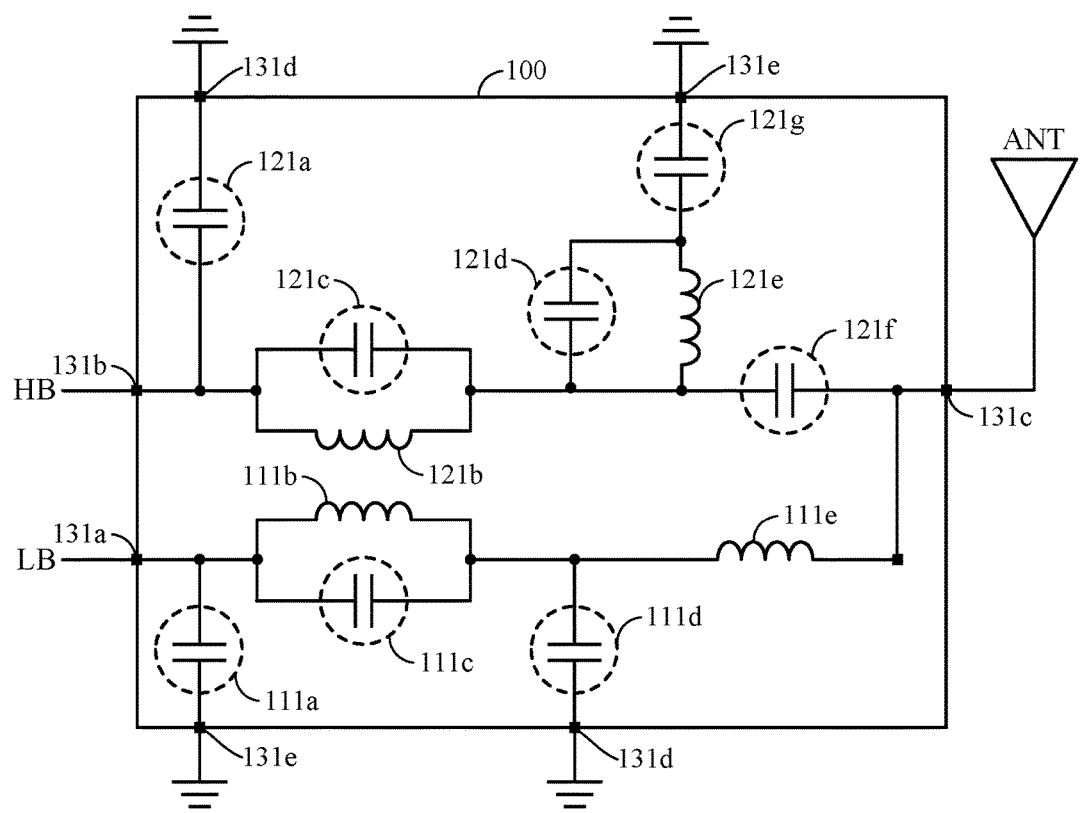
FIG. 1 generally illustrates a schematic diagram of a multiplexer in accordance with an aspect of the disclosure.

FIG. 1 generally illustrates a schematic diagram of a circuit 100 in accordance with an aspect of the disclosure. The circuit 100 may be, for example, a multiplexer.

The circuit 100 may include a first subset of circuit elements 111a-111e (which may be referred to collectively as first subset of circuit elements 111) and a second subset of circuit elements 121a-121g (which may be referred to collectively as first subset of circuit elements 121). The first subset of circuit elements 111 and the second subset of circuit elements 121 may each include a plurality of passive electrical components (for example, capacitors and inductors) coupled to one another via conductive traces. The conductive traces may be configured to create direct electrical couplings between various components of the circuit 100.

The circuit 100 may further include a plurality of terminals 131a-131e (which may be referred to collectively as first subset of circuit elements 111). As depicted in FIG. 1, the plurality of terminals 131 may include a LB terminal 131a (wherein "LB" stands for low-frequency band), a HB terminal 131b (wherein "HB" stands for high-frequency band), and an antenna terminal 131c. The plurality of terminals 131 may further include one or more ground terminals, for example, a first ground terminal 131d and a second ground terminal 131e.

As further depicted in FIG. 1, the LB terminal 131a may be coupled to the antenna terminal 131c and one or more ground terminals via the first subset of circuit elements 111. In particular, the LB terminal 131a may be coupled via conductive trace to a first LB capacitor 111a, a first LB inductor 111b, and a second LB capacitor 111c. The first LB capacitor 111a may be coupled via conductive trace to the one or more ground terminals, for example, second ground terminal 131e. The first LB inductor 111b and the second LB capacitor 111c may be disposed in parallel and may be coupled via conductive trace to a third LB capacitor 111d and a second LB inductor 111e. The third LB capacitor 111d may be coupled via conductive trace to the one or more ground terminals, for example, first ground terminal 131d. The second LB inductor 111e may be coupled via conductive trace to the antenna terminal 131c.

It will be understood that although the first subset of circuit elements 111 may include one or more of the first LB capacitor 111a, the first LB inductor 111b, the second LB capacitor 111c, the third LB capacitor 111d, and the second LB inductor 111e, as depicted in FIG. 1, the first subset of circuit elements 111 may include fewer components than appear in FIG. 1, or more components apart from those listed.

The HB terminal 131b may be coupled to the antenna terminal 131c and one or more ground terminals via the second subset of circuit elements 121. In particular, the HB terminal 131b may be coupled via conductive trace to a first HB capacitor 121a, a first HB inductor 121b, and a second HB capacitor 121c. The first HB capacitor 121a may be coupled via conductive trace to the one or more ground terminals, for example, first ground terminal 131d. The first HB inductor 121b and the second HB capacitor 121c may be disposed in parallel and may be coupled via conductive trace to a third HB capacitor 121d, a second HB inductor 121e, and a fourth HB capacitor 121f. The third HB capacitor 121d and the second HB inductor 121e may be disposed in parallel and may be coupled via conductive trace to a fifth HB capacitor 121g. The fifth HB capacitor 121g may be coupled to the one or more ground terminals, for example, the second ground terminal 131e. The fourth HB capacitor 121f may be coupled via conductive trace to the antenna terminal 131c.

It will be understood that although the second subset of circuit elements 121 may include one or more of the first HB capacitor 121a, the first HB inductor 121b, the second HB capacitor 121c, the third HB capacitor 121d, the second HB inductor 121e, the fourth HB capacitor 121f, and the fifth HB capacitor 121g, as depicted in FIG. 1, the second subset of circuit elements 121 may include fewer components than appear in FIG. 1, or more components apart from those listed.

In some implementations, the first subset of circuit elements 111 may be configured to filter a signal received from either the LB terminal 131a or the antenna terminal 131c. Moreover, the second subset of circuit elements 121 may be configured to filter a signal received from either the HB terminal 131b or the antenna terminal 131c. The filtering performed by the first subset of circuit elements 111 and/or the second subset of circuit elements 121 may reduce signal components that are outside of a particular frequency bandwidth. For example, the first subset of circuit elements 111 may reduce signal components that are outside of a LB frequency bandwidth centered around a first frequency, and the second subset of circuit elements 121 may reduce signal components that are outside of a HB frequency bandwidth centered around a second frequency, wherein the second frequency is higher than the first frequency. The LB frequency bandwidth and the HB frequency bandwidth may be non-overlapping. Moreover, the first subset of circuit elements may include a first inductor and a first capacitor and the second subset of circuit elements may include a second inductor having a lower inductance than the first inductor and a second capacitor having a lower capacitance than the first capacitor.

The circuit 100 may be coupled to one or more processors, one or more memories, or one or more other components of a wireless communication device via the LB terminal 131a and/or the HB terminal 131b. The circuit 100 may be a multiplexer that is coupled to an antenna via the antenna terminal 131c and coupled to a ground of a wireless communication device via the one or more ground terminals, for example, the first ground terminal 131d and/or the second ground terminal 131e.

Figure 2:
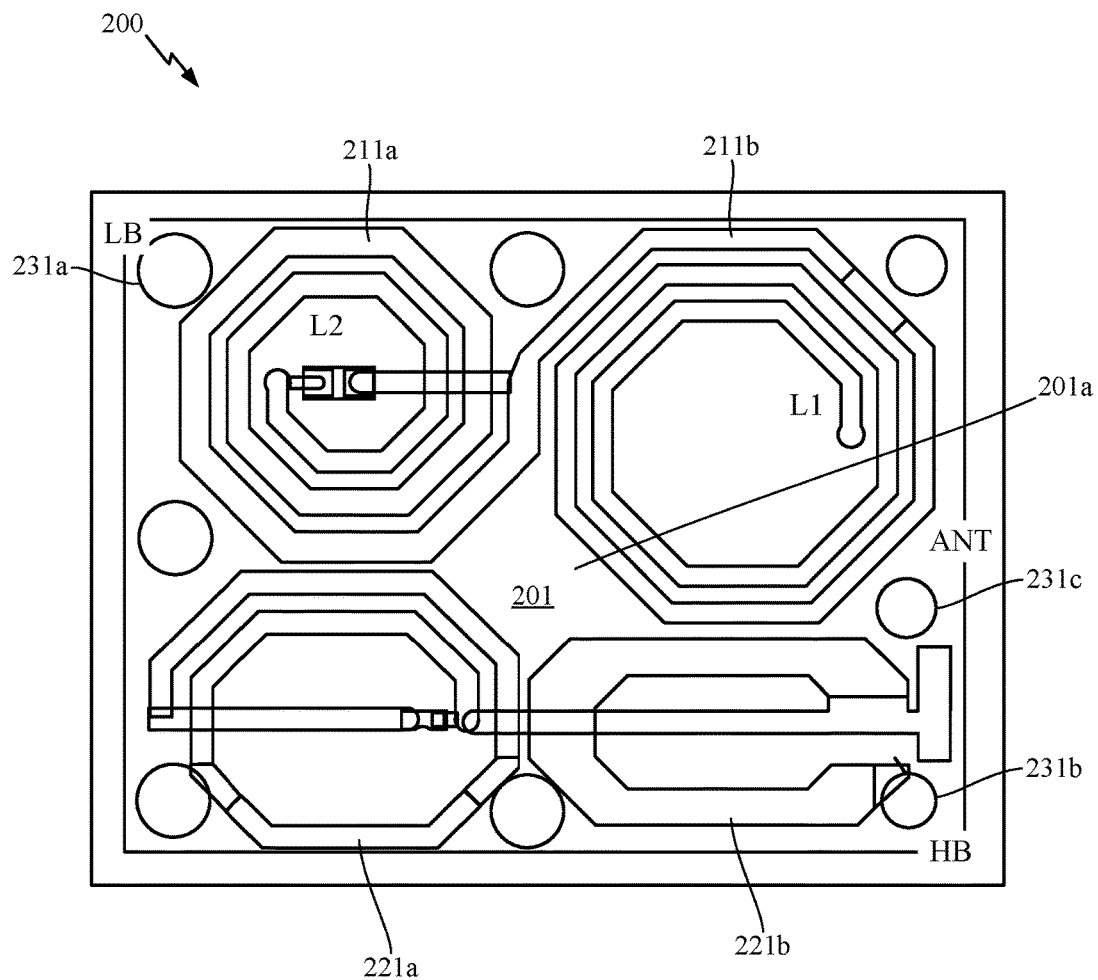
FIG. 2 generally illustrates a conventional planar circuit layout for implementing a multiplexer.

FIG. 2 generally illustrates a conventional planar circuit layout 200 for implementing a circuit, for example, a multiplexer. The circuit depicted in FIG. 2 may have some components that are analogous to the components depicted in FIG. 1. For example, the circuit depicted in FIG. 2 may include a first subset of circuit elements that include a first LB inductor 211a and a second LB inductor 211b. The circuit depicted in FIG. 2 may further include a second subset of circuit elements that include a first HB inductor 221a and a second HB inductor 221b. The circuit depicted in FIG. 2 may further include a LB terminal 231a, a HB terminal 231b, and an antenna terminal 231c. It will be understood that the various components depicted in FIG. 2 may be analogous in some respects to the various terminals and inductors depicted in FIG. 1.

As will be understood from FIG. 2, the first LB inductor 211a, the second LB inductor 211b, the first HB inductor 221a, and the second HB inductor 221b are each implemented as spiral inductors fabricated on a first planar surface 201a of a substrate 201. The area of the first planar surface 201a must be large enough to accommodate each of the spiral inductors depicted in FIG. 2. However, there is a need in the field of wireless communication devices to reduce the size of multiplexers, which tend to include relatively large components (such as, for example, the inductors depicted in FIG. 2). Accordingly, new circuit layouts are required that reduce the area of, for example, the first planar surface 201a of the substrate 201.

As will be further understood from FIG. 2, the various components may be disposed in close proximity to one another. For example, the first LB inductor 211a is relatively proximate to the first HB inductor 221a and the second LB inductor 211b is relatively proximate to the second HB inductor 221b. As a result, the close proximity of the components may cause, for example, cross-talk, thereby distorting the signal as it passes through the multiplexer. Accordingly, new circuit layouts are required that reduce the proximity between components.

Figure 3A:
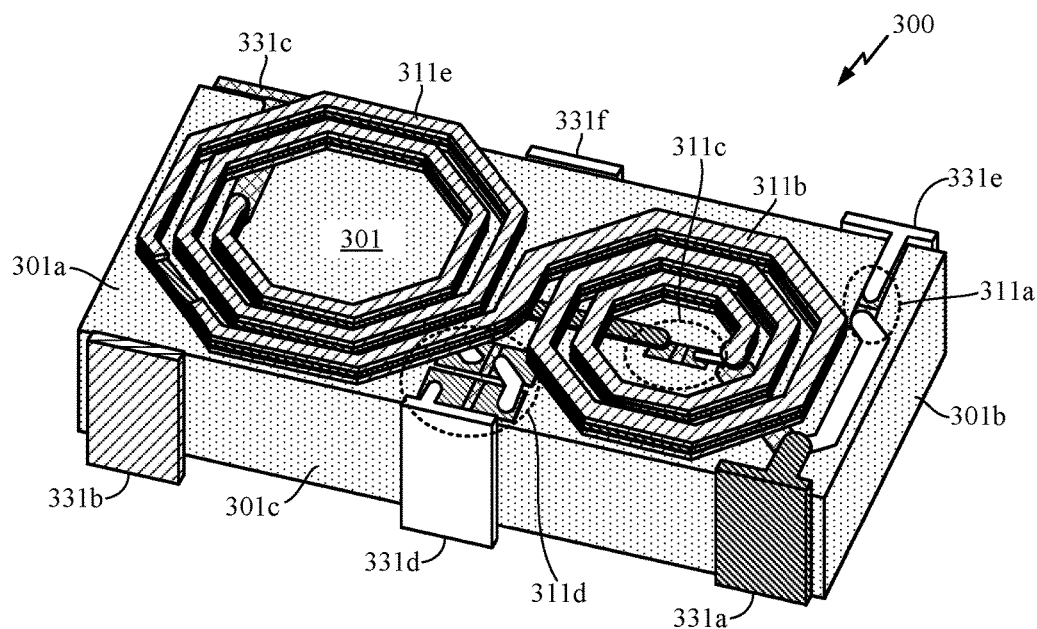
FIG. 3A generally illustrates a top isometric view of a double-sided circuit layout for implementing a multiplexer in accordance with an aspect of the disclosure.
Figure 3B:
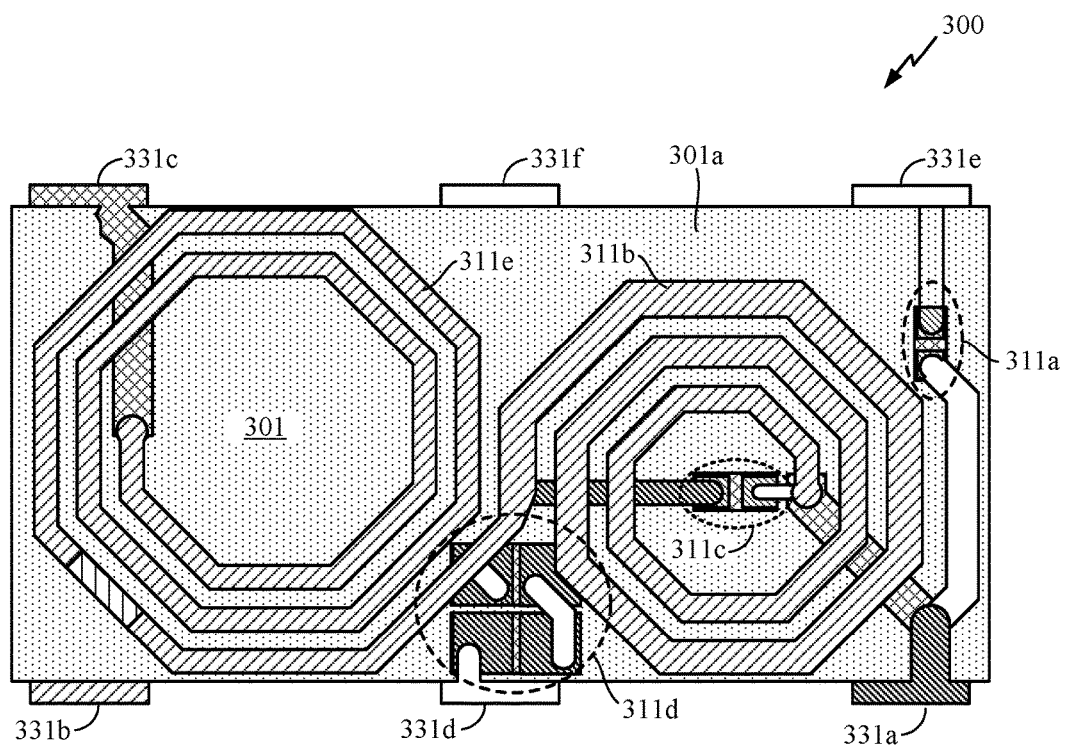
FIG. 3B generally illustrates a top view of the double-sided circuit layout of FIG. 3A.
Figure 3C:
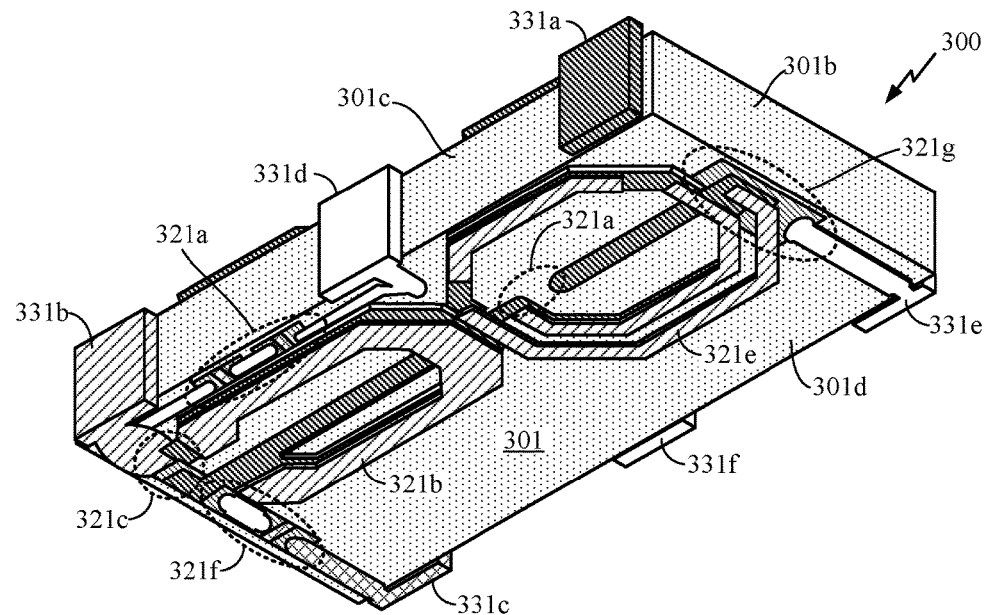
FIG. 3C generally illustrates a bottom isometric view of the double-sided circuit layout of FIGS. 3A-3B.
Figure 3D:
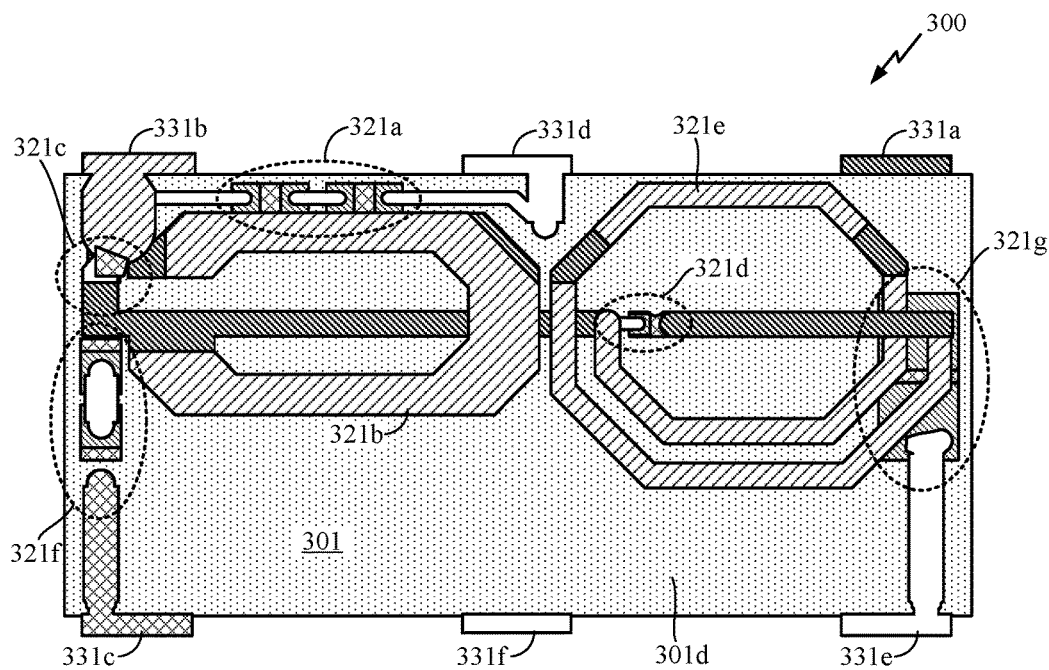
FIG. 3D generally illustrates a bottom view of the double-sided circuit layout of FIGS. 3A-3C.

FIGS. 3A-3D generally illustrate a double-sided circuit layout for implementing a circuit 300 in accordance with an aspect of the disclosure. The circuit 300 may be, for example, a multiplexer. FIGS. 3A-3B provide top-down views of the circuit 300 whereas FIGS. 3C-3D provide bottom-up views of the circuit 300. However, it will be understood that terms such as "top" and "bottom" are relative terms used strictly in relation to one another, and do not express or imply any relation with respect to gravity, a manufacturing device used to manufacture the circuit 300, or to some other device to which the circuit 300 is coupled, mounted, etc.

The circuit 300 includes an insulator 301. The insulator 301 may include a first surface 301a on a top of the insulator 301 and a second surface 301d on a bottom of the insulator 301. The first surface 301a and the second surface 301d may each be substantially planar. The first surface 301a can be seen in FIGS. 3A-3B and the second surface 301d can be seen in FIGS. 3C-3D. A first subset of circuit elements may be disposed on the first surface 301a and a second subset of circuit elements may be disposed on the second surface 301d.

The insulator 301 may further include a periphery that separates the first surface 301a from the second surface 301d. As depicted in FIG. 3A, the periphery may include a first peripheral surface 301b and a second peripheral surface 301c. Although two peripheral surfaces are shown and two others may be inferred, it will be understood that the periphery of the insulator 301 may include any number of peripheral surfaces. Although the first peripheral surface 301b and the second peripheral surface 301c are shown as planar surfaces that are orthogonal to one another, it will be understood that other arrangements are possible without departing from the scope of the present disclosure.

The insulator 301 may have an insulator thickness defined by a distance between the first surface 301a and the second surface 301d. The insulator thickness of the insulator 301 may be greater than the respective thicknesses of the circuit elements provided thereon (which will be described in greater detail below). The insulator 301 may be formed of any suitable material. For example, the insulator 301 may include glass.

One or more conductive sidewalls may be disposed on the periphery of the insulator 301. The one or more conductive sidewalls may be configured as terminals. Accordingly, the one or more conductive sidewalls 331 may include a LB terminal 331a, a HB terminal 331b, an antenna terminal 331c, and one or more ground terminals, for example, a first ground terminal 331d and a second ground terminal 331e. The LB terminal 331a, the HB terminal 331b, the antenna terminal 331c, the first ground terminal 331d, and the second ground terminal 331e may be analogous to the LB terminal 131a, the HB terminal 131b, the antenna terminal 131c, the first ground terminal 131d, and the second ground terminal 131e, respectively, depicted in FIG. 1. The one or more conductive sidewalls 331 may further include a dummy terminal 331f. Alternatively, the dummy terminal 331f may be non-conductive or may be omitted altogether.

As shown in FIG. 3A, a first subset of circuit elements 311 may be disposed on the first surface 301a. The first subset of circuit elements 311 may include a first LB capacitor 311a, a first LB inductor 311b, a second LB capacitor 311c, a third LB capacitor 311d, and a second LB inductor 311e. The first LB capacitor 311a, the first LB inductor 311b, the second LB capacitor 311c, the third LB capacitor 311d, and the second LB inductor 311e depicted in FIGS. 3A-3B may be analogous to the first LB capacitor 111a, the first LB inductor 111b, the second LB capacitor 111c, the third LB capacitor 111d, and the second LB inductor 111e, respectively, depicted in FIG. 1.

As further depicted in FIGS. 3A-3B, the LB terminal 331a may be coupled to the antenna terminal 331c and the one or more ground terminals via the first subset of circuit elements 311. In particular, the LB terminal 331a may be coupled via conductive trace to a first LB capacitor 311a, a first LB inductor 311b, and a second LB capacitor 311c. The first LB capacitor 311a may be coupled via conductive trace to the one or more ground terminals, for example, second ground terminal 331e. The first LB inductor 311b and second LB capacitor 311c may be disposed in parallel and may be coupled via conductive trace to a third LB capacitor 311d and a second LB inductor 311e. The third LB capacitor 311d may be coupled via conductive trace to the one or more ground terminals, for example, first ground terminal 331d. The second LB inductor 311e may be coupled via conductive trace to the antenna terminal 331c.

It will be understood that although the first subset of circuit elements 311 may include one or more of the first LB capacitor 311a, the first LB inductor 311b, the second LB capacitor 311c, the third LB capacitor 311d, and the second LB inductor 311e, as depicted in FIGS. 3A-3B, the first subset of circuit elements 311 may include fewer components than appear in FIGS. 3A-3B, or more components apart from those listed.

As shown in FIGS. 3C-3D, a second subset of circuit elements 321 may be disposed on the second surface 301d. The second subset of circuit elements 321 may include a first HB capacitor 321a, a first HB inductor 321b, a second HB capacitor 321c, a third HB capacitor 321d, a second HB inductor 321e, a fourth HB capacitor 321f, and a fifth HB capacitor 321g. The first HB capacitor 321a, the first HB inductor 321b, the second HB capacitor 321c, the third HB capacitor 321d, the second HB inductor 321e, the fourth HB capacitor 321f, and the fifth HB capacitor 321g depicted in FIGS. 3C-3D may be analogous to the first HB capacitor 121a, the first HB inductor 121b, the second HB capacitor 121c, the third HB capacitor 121d, the second HB inductor 121e, the fourth HB capacitor 121f, and the fifth HB capacitor 121g, respectively, depicted in FIG. 1.

The HB terminal 331b may be coupled to the antenna terminal 331c and one or more ground terminals via the second subset of circuit elements 321. In particular, the HB terminal 331b may be coupled via conductive trace to a first HB capacitor 321a, a first HB inductor 321b, and a second HB capacitor 321c. The first HB capacitor 321a may be coupled via conductive trace to the one or more ground terminals, for example, the first ground terminal 331d. The first HB inductor 321b and the second HB capacitor 321c may be disposed in parallel and may be coupled via conductive trace to a third HB capacitor 321d, a second HB inductor 321e, and a fourth HB capacitor 321f. The third HB capacitor 321d and the second HB inductor 321e may be disposed in parallel and may be coupled via conductive trace to a fifth HB capacitor 321g. The fifth HB capacitor 321g may be coupled to the one or more ground terminals, for example, the second ground terminal 331e. The fourth HB capacitor 321f may be coupled via conductive trace to the antenna terminal 331c.

It will be understood that although the second subset of circuit elements 321 may include one or more of the first HB capacitor 321a, the first HB inductor 321b, the second HB capacitor 321c, the third HB capacitor 321d, the second HB inductor 321e, the fourth HB capacitor 321f, and the fifth HB capacitor 321g, as depicted in FIGS. 3C-3D, the second subset of circuit elements 321 may include fewer components than appear in FIGS. 3C-3D, or more components apart from those listed.

In some implementations, the first subset of circuit elements 311 may be configured to filter a signal received from either the LB terminal 331a or the antenna terminal 331c. Moreover, the second subset of circuit elements 321 may be configured to filter a signal received from either the HB terminal 331b or the antenna terminal 331c. The filtering performed by the first subset of circuit elements 311 and/or the second subset of circuit elements 321 may reduce signal components that are outside of a particular frequency bandwidth. For example, the first subset of circuit elements 311 may reduce signal components that are outside of a LB frequency bandwidth centered around a first frequency, and the second subset of circuit elements 321 may reduce signal components that are outside of a HB frequency bandwidth centered around a second frequency, wherein the second frequency is higher than the first frequency. The LB frequency bandwidth and the HB frequency bandwidth may be non-overlapping.

The circuit 300 may be coupled to one or more processors, one or more memories, or one or more other components of a wireless communication device via the LB terminal 331a and/or the HB terminal 331b. The circuit 300 may be coupled to an antenna via the antenna terminal 331c and may be coupled to a ground of a wireless communication device via the one or more ground terminals, for example, the first ground terminal 331d and/or the second ground terminal 331e.

In some implementations, the one or more conductive sidewalls 331 may conform to a particular footprint. For example, the footprint of the circuit 300 may have an area that is substantially equal to an area of the first surface 301a and/or the second surface 301d. Moreover, the footprint of the circuit 300 may be substantially rectangular. The rectangular footprint may have two long sides with respective lengths substantially equal to x millimeters and two short sides with respective lengths equal to y millimeters. For example, the rectangular footprint may be 2.5 millimeters by 2.0 millimeters, 2.0 millimeters by 1.25 millimeters, 1.6 millimeters by 0.8 millimeters, or any other suitable footprint.

The HB terminal 331b, the first ground terminal 331d, and the LB terminal 331a may be disposed on a first long side of the rectangular footprint, as shown in FIGS. 3C-3D, and the antenna terminal 331c, the dummy terminal 331f, and the second ground terminal 331e may be disposed on a second long side of the rectangular footprint opposite the HB terminal 331b, the first ground terminal 331d, and the LB terminal 331a, respectively. As noted above, in some implementations, the dummy terminal 331f may be non-conductive, or may be omitted altogether.

In some implementations, either the first ground terminal 331d or the second ground terminal 331e may be omitted or replaced with a conductive or non-conductive dummy terminal. For example, the first LB capacitor 311a and the fifth HB capacitor 321g may be coupled via conductive trace to the first ground terminal 331d rather than the second ground terminal 331e and the second ground terminal 331e may be omitted or replaced with a dummy terminal analogous to the dummy terminal 331f. Alternatively, the first HB capacitor 321a and the third LB capacitor 311d may be coupled via conductive trace to the second ground terminal 331e rather than the first ground terminal 331d and the first ground terminal 331d may be omitted or replaced with a dummy terminal analogous to the dummy terminal 331f. For example, one or more through vias or conductive traces may be formed through, or disposed on, one or more surfaces of the insulator 301.

In some implementations (such as the implementation depicted in FIGS. 3A-3D, the insulator 301 may be a solid volume having no holes or through vias running from the first surface 301a to the second surface 301d, and no holes or through vias running from one peripheral surface to another peripheral surface. Instead, all conductive interconnections between the first surface 301a and the second surface 301d are formed of conductive sidewalls 331 disposed on the periphery of the insulator 301. In other implementations, the insulator 301 may have one or more holes or conductive interconnections disposed within the insulator 301 as an alternative to, or in addition to, the conductive sidewalls 331.

Figure 4:
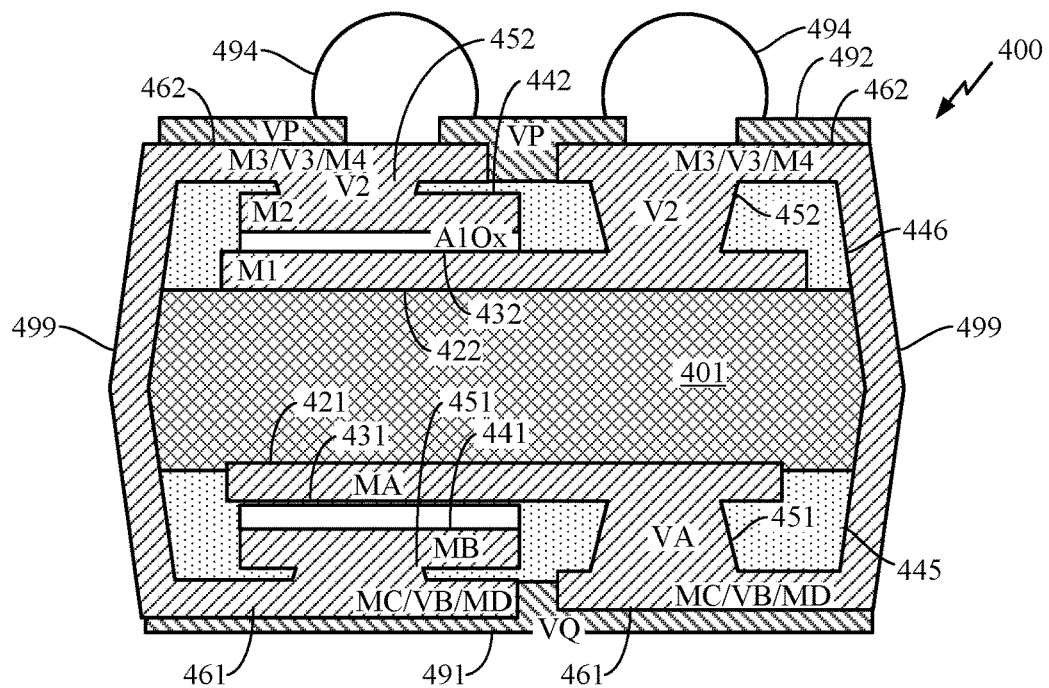
FIG. 4 generally illustrates a side view of a double-sided circuit layout for implementing a multiplexer circuit in accordance with another aspect of the disclosure.

FIG. 4 generally illustrates a side view of a double-sided circuit layout for implementing a circuit 400 in accordance with another aspect of the disclosure.

The circuit 400 may be, for example, a multiplexer. The circuit 400 may include an insulator 401 having a first surface and a second surface. The first surface and the second surface may be analogous to the first surface 301a and the second surface 301d, respectively, depicted in FIGS. 3A-3D. The first surface may have a first inner conductive layer 421 disposed thereon and the second surface may have a second inner conductive layer 422 disposed thereon. The first inner conductive layer 421 may form a terminal of one or more capacitors analogous to, for example, the first LB capacitor 311a, the second LB capacitor 311c, and/or the third LB capacitor 311d. The second inner conductive layer 422 may form a terminal of one or more capacitors analogous to, for example, the first HB capacitor 321a, the second HB capacitor 321c, the third HB capacitor 321d, the fourth HB capacitor 321f, and/or the fifth HB capacitor 321g. The first inner conductive layer 421 and the second inner conductive layer 422 may include any suitable material, for example, copper. The first inner conductive layer 421 and the second inner conductive layer 422 may have any suitable thickness, for example, two micrometers, and may be significantly less thick than the insulator 401.

The first inner conductive layer 421 may have a first dielectric layer 431 disposed thereon and the second inner conductive layer 422 may have a second dielectric layer 432 disposed thereon. The first dielectric layer 431 may form a dielectric layer of one or more capacitors analogous to, for example, the first LB capacitor 311a, the second LB capacitor 311c, and/or the third LB capacitor 311d. The second dielectric layer 432 may form a dielectric layer of one or more capacitors analogous to, for example, the first HB capacitor 321a, the second HB capacitor 321c, the third HB capacitor 321d, the fourth HB capacitor 321f, and/or the fifth HB capacitor 321g. The first dielectric layer 431 and the second dielectric layer 432 may include any suitable material, for example, aluminum oxide and/or silicon nitride.

The first dielectric layer 431 may have a first middle conductive layer 441 disposed thereon and the second dielectric layer 432 may have a second middle conductive layer 442 disposed thereon. The first middle conductive layer 441 may form a terminal of one or more capacitors analogous to, for example, the first LB capacitor 311a, the second LB capacitor 311c, and/or the third LB capacitor 311d. The second middle conductive layer 442 may form a terminal of one or more capacitors analogous to, for example, the first HB capacitor 321a, the second HB capacitor 321c, the third HB capacitor 321d, the fourth HB capacitor 321f, and/or the fifth HB capacitor 321g. The first middle conductive layer 441 and the second middle conductive layer 442 may include any suitable material, for example, copper. The first middle conductive layer 441 and the second middle conductive layer 442 may have any suitable thickness, for example, two micrometers, and may be significantly less thick than the insulator 401.

The first inner conductive layer 421, the first dielectric layer 431, and the first middle conductive layer 441 may be embedded in a first middle insulator 445. The first inner conductive layer 421, the first dielectric layer 431, and the first middle conductive layer 441 may be embedded in a second middle insulator 446. The first middle insulator 445 and the second middle insulator 446 may include any suitable material, for example, laminate.

The first middle insulator 445 may have one or more first vias 451 formed therein and the second middle insulator 446 may have one or more second vias 452 formed therein. The one or more first vias 451 may be electrically conductive and may be coupled to the first inner conductive layer 421 and/or the first middle conductive layer 441. The one or more second vias 452 may be electrically conductive and may be coupled to the second inner conductive layer 422 and/or the second middle conductive layer 442.

The first middle insulator 445 may have a first outer conductive layer 461 disposed thereon and the second middle insulator 446 may have a second outer conductive layer 462 formed thereon. The first outer conductive layer 461 may be in contact with one or more of the one or more first vias 451 and the second outer conductive layer 462 may be in contact with one or more of the one or more second vias 452. Portions of the first outer conductive layer 461 and the second outer conductive layer 462 may take the shape of spiral inductors. For example, the first LB inductor 311b and/or the second LB inductor 311e depicted in FIGS. 3A-3B may be formed of the first outer conductive layer 461 and the first HB inductor 321b and/or the second HB inductor 321e may be formed of the second outer conductive layer 462.

Each of the first outer conductive layer 461 and the second outer conductive layer 462 may include three sublayers, an inner conductive sublayer, an insulative sublayer having vias therethrough, and an outer conductive sublayer.

A first outer insulating layer 491 may be disposed on the first outer conductive layer 461 and/or the first middle insulator 445 and a second outer insulating layer 492 may be disposed on the second outer conductive layer 462 and/or the second middle insulator 446. The first outer insulating layer 491 and/or the second outer insulating layer 492 may be patterned so as to expose one or more portions of the first outer conductive layer 461 and/or the second outer conductive layer 462, respectively. The first outer insulating layer 491 and/or the second outer insulating layer 492 may include solder-resistant material.

One or more solder balls 494 may be disposed in a ball grid array (BGA) on the first outer insulating layer 491 and/or the second outer insulating layer 492. The one or more solder balls 494 may be placed into contact with the one or more exposed portions of the first outer conductive layer 461 and/or the second outer insulating layer 492. As depicted in FIG. 4, the one or more solder balls 494 are disposed on the first outer insulating layer 491 and placed into contact with one or more exposed portions of the first outer conductive layer 461. However, it will be understood that the one or more solder balls 494 may be placed on either side of the circuit 400.

One or more conductive sidewalls 499 may be disposed on the periphery of the insulator 401, the first middle insulator 445, and/or the second middle insulator 446. The one or more conductive sidewalls 499 may contact the first inner conductive layer 421, the first middle conductive layer 441, the first outer conductive layer 461, the second inner conductive layer 422, the second middle conductive layer 442, the second outer conductive layer 462, or any combination thereof.

Figure 5:
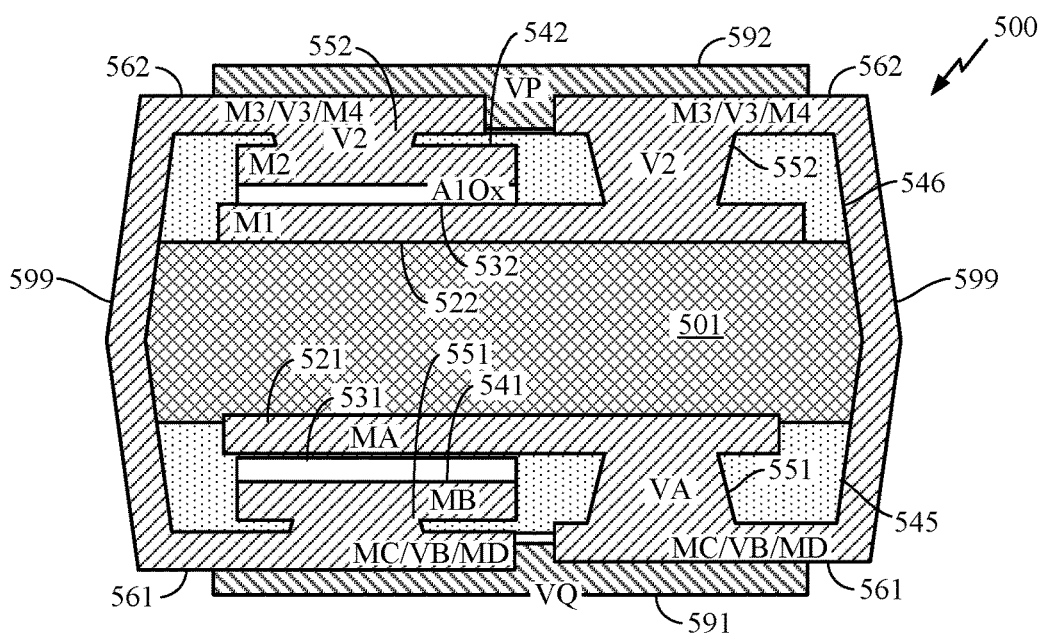
FIG. 5 generally illustrates a side view of a double-sided circuit layout for implementing a multiplexer circuit in accordance with yet another aspect of the disclosure.

FIG. 5 generally illustrates a side view of a double-sided circuit layout for implementing a circuit 500 in accordance with yet another aspect of the disclosure. The circuit 500 may be, for example, a multiplexer. FIG. 5 includes a number of elements that are analogous to the elements described previously with respect to FIG. 4. For example, the circuit 500 may include an insulator 501 analogous to the insulator 401, a first inner conductive layer 521 and a second inner conductive layer 522 analogous to the first inner conductive layer 421 and the second inner conductive layer 422, respectively, a first dielectric layer 531 and a second dielectric layer 532 analogous to the first dielectric layer 431 and the second dielectric layer 432, respectively, a first middle conductive layer 541 and a second middle conductive layer 542 analogous to the first middle conductive layer 441 and the second middle conductive layer 442, respectively, a first middle insulator 545 and a second middle insulator 546 analogous to the first middle insulator 445 and the second middle insulator 446, respectively, one or more first vias 551 and one or more second vias 552 analogous to the one or more first vias 451 and the one or more second vias 452, respectively, a first outer conductive layer 561 and a second outer conductive layer 562 analogous to the first outer conductive layer 461 and the second outer conductive layer 462, respectively, a first outer insulating layer 591 and a second outer insulating layer 592 analogous to the first outer insulating layer 491 and the second outer insulating layer 492, respectively and one or more conductive sidewalls 599 analogous to the one or more conductive sidewalls 499.

Accordingly, only the differences between the circuit 500 and the circuit 400 depicted in FIG. 4 will be described here. For example, the circuit 500 is arranged in a land grid array (LGA) package rather than a BGA package. The first outer insulating layer 591 and/or the second outer insulating layer 592 may not be patterned. Accordingly, the first outer conductive layer 561 and/or the second outer conductive layer 562 may not be exposed to a top or bottom surface of the circuit 500. Moreover, the one or more solder balls 494 depicted in FIG. 4 are omitted from the circuit 500. Instead of solder balls 494, the one or more conductive sidewalls 599 may be used as terminals of the circuit 500. In particular, the one or more conductive sidewalls 599 may be analogous to, for example, one or more of the conductive sidewalls 331 depicted in FIGS. 3A-3D.

Figure 6:
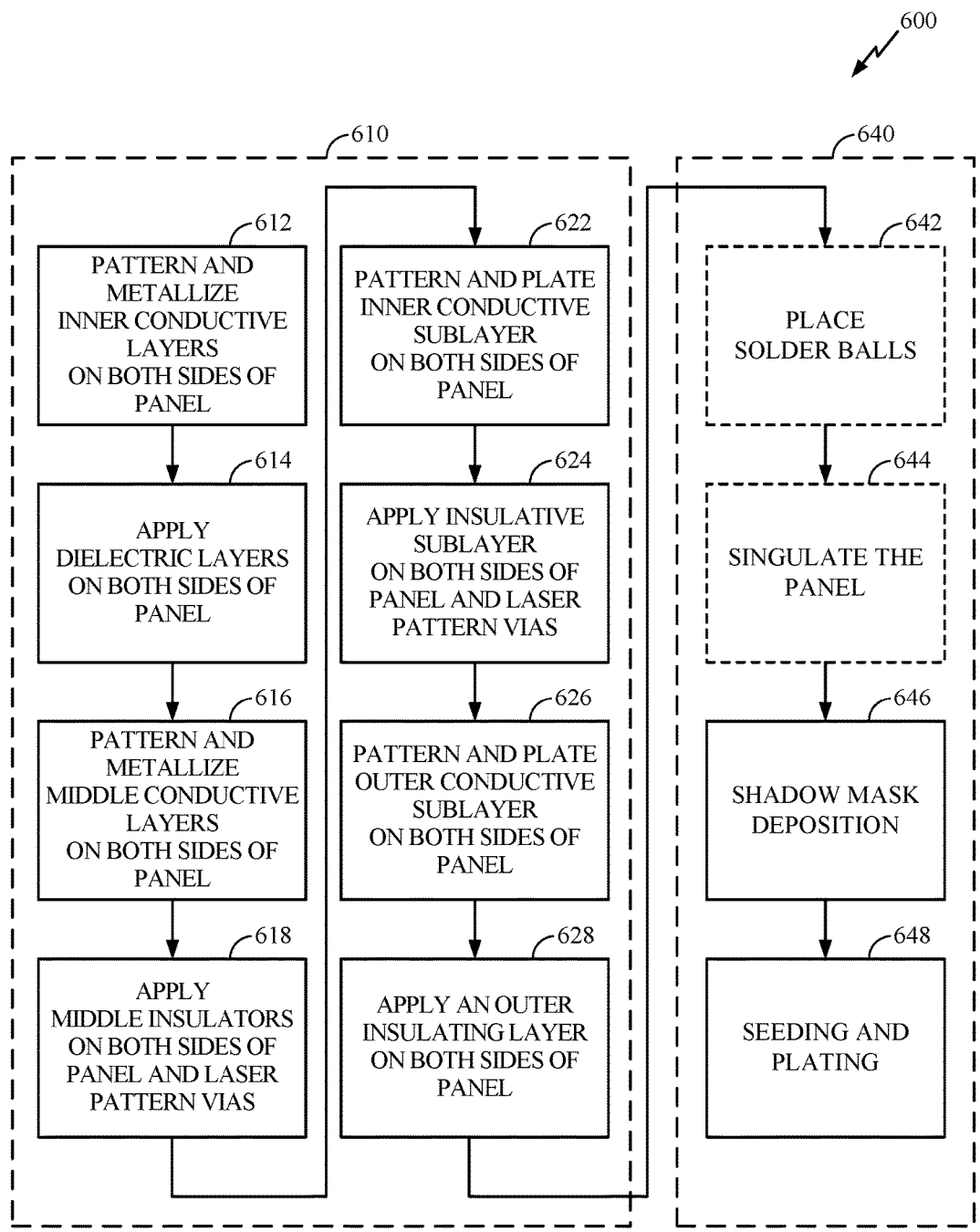
FIG. 6 generally illustrates a flow diagram for manufacturing a multiplexer having a double-sided circuit layout in accordance with yet another aspect of the disclosure.

FIG. 6 is a flow diagram generally illustrating a method 600 for manufacturing a circuit having a double-sided circuit layout in accordance with yet another aspect of the disclosure. The circuit may be, for example, a multiplexer. A circuit manufactured in accordance with the method 600 may be analogous to the any of the circuits depicted in FIG. 1, FIGS. 3A-3D, FIG. 4, and/or FIG. 5. However, the method 600 will be described as it would be performed to manufacture the circuit 500 depicted in FIG. 5.

A first portion 610 of the method 600 may be performed on a panel. The first portion 610 may be performed as a double-sided passive-on-glass (PoG) process.

At 612, the method 600 patterns and metallizes inner conductive layers on both sides of a panel. The panel may include a sheet of insulator, for example, a sheet of glass. The glass may form the insulator 501 in at least one circuit 500 manufactured in accordance with the method 600. The inner conductive layers may be analogous to the first inner conductive layer 521 and the second inner conductive layer 522.

At 614, the method 600 applies dielectric layers on both sides of the panel. The dielectric layers may be selectively applied to portions of the inner conductive layers patterned and metallized at 612. The dielectric layers may be analogous to the first dielectric layer 531 and the second dielectric layer 532.

At 616, the method 600 patterns and metallizes middle conductive layers on both sides of the panel. The middle conductive layers may be analogous to the first middle conductive layer 541 and the second middle conductive layer 542. The inner conductive layers, dielectric layers, and outer conductive layers may be configured to form capacitors on both sides of the panel.

At 618, the method 600 applies middle insulators on both sides of the panel and laser patterns vias therein. The inner conductive layers, dielectric layers, and outer conductive layers may be embedded in the middle insulators applied at 618. The application of the middle insulators may include laminating, and the middle insulators may include laminate. The middle insulators may be analogous to the first middle insulator 545 and the second middle insulator 546. The laser patterning may include exposing selected portions of the inner conductive layers and/or the outer conductive layers by forming vias in the middle insulators. The vias may be filled with any suitable conductive material, for example, copper.

At 622, the method 600 patterns and plates inner conductive sublayers on both sides of the panel. Selected portions of the inner conductive sublayers may contact the vias formed at 618. Accordingly, the inner conductive sublayer may be in electrical contact with selected portions of the inner conductive layers and/or the outer conductive layers. Portions of the inner conductive sublayers may be patterned to form spiral inductors.

At 624, the method 600 applies an insulative sublayer on both sides of the panel and laser patterns vias therein. The inner conductive sublayers patterned and plated at 622 may be embedded in the middle insulators applied at 624. The laser patterning may include exposing selected portions of the inner conductive sublayers by forming vias in the insulative sublayer. The vias may be filled with any suitable conductive material, for example, copper.

At 626, the method 600 patterns and plates outer conductive sublayers on both sides of the panel. Selected portions of the outer conductive sublayers may contact the vias formed at 624. Accordingly, selected portions of the outer conductive sublayers may be in electrical contact with selected portions of the inner conductive sublayers. Portions of the outer conductive sublayers may be patterned to form spiral inductors. In particular, the inner conductive sublayers patterned and plated at 622, the vias laser patterned at 624, and the outer conductive sublayers patterned and plated at 626 may be configured to form inductors on both sides of the panel. The three sublayers formed at 622, 624, and 626 may form outer conductive layers analogous to the first outer conductive layer 561 and the second outer conductive layer 562.

At 628, the method 600 applies an outer insulating layer on both sides of the panel. The outer insulating layer may be analogous to the first outer insulating layer 591 and the second outer insulating layer 592.

Alternatively, if the method 600 is to manufacture the circuit 400 having the BGA package, the outer insulating layer may be analogous to the first outer insulating layer 491 and the second outer insulating layer 492 depicted in FIG. 4. Accordingly, the method 600 may optionally pattern the first outer insulating layer 491 and/or the second outer insulating layer 492 on one or more sides of the panel for solder ball placement.

A second portion 640 of the method 600 may be a back-end process.

At 642, the method 600 optionally places solder balls. As noted above, the placing of solder balls at 642 may only be necessary when manufacturing the circuit 400 having the BGA package, as depicted in FIG. 4. The solder balls placed at 642 may be analogous to the solder balls 494 depicted in FIG. 4.

At 644, the method 600 optionally singulates the panel. The singulating may be performed if a plurality of circuits are formed on the panel. The singulating may include slicing the panel to separate the plurality of circuits from one another.

At 646 and 648, the method 600 metallizes sidewalls of the circuit 500. The metallized sidewalls may be analogous to the conductive sidewalls 599.

At 646, the method 600 may perform shadow mask deposition. The shadow mask deposition may use dry chemistry, for example, metal evaporation or sputtering of titanium (Ti), chromium (Cr), and/or another suitable material.

At 648, the method 600 may deposit nickel (Ni), copper (Cu), and/or another suitable material onto the shadow mask deposit as a seed layer, and then perform, for example, electroless nickel plating and/or electroplating solder.

Additionally or alternatively, the metallizing at 646 and 648 may be performed as follows. At 646, the method 600 may perform paste printing using, for example, screens or stencils. Then, at 648, the method 600 may remove any organics that made the metal material screen/stencil printable. The removal at 648 may include sintering or reflow (if the paste is solder material).

Figure 7:
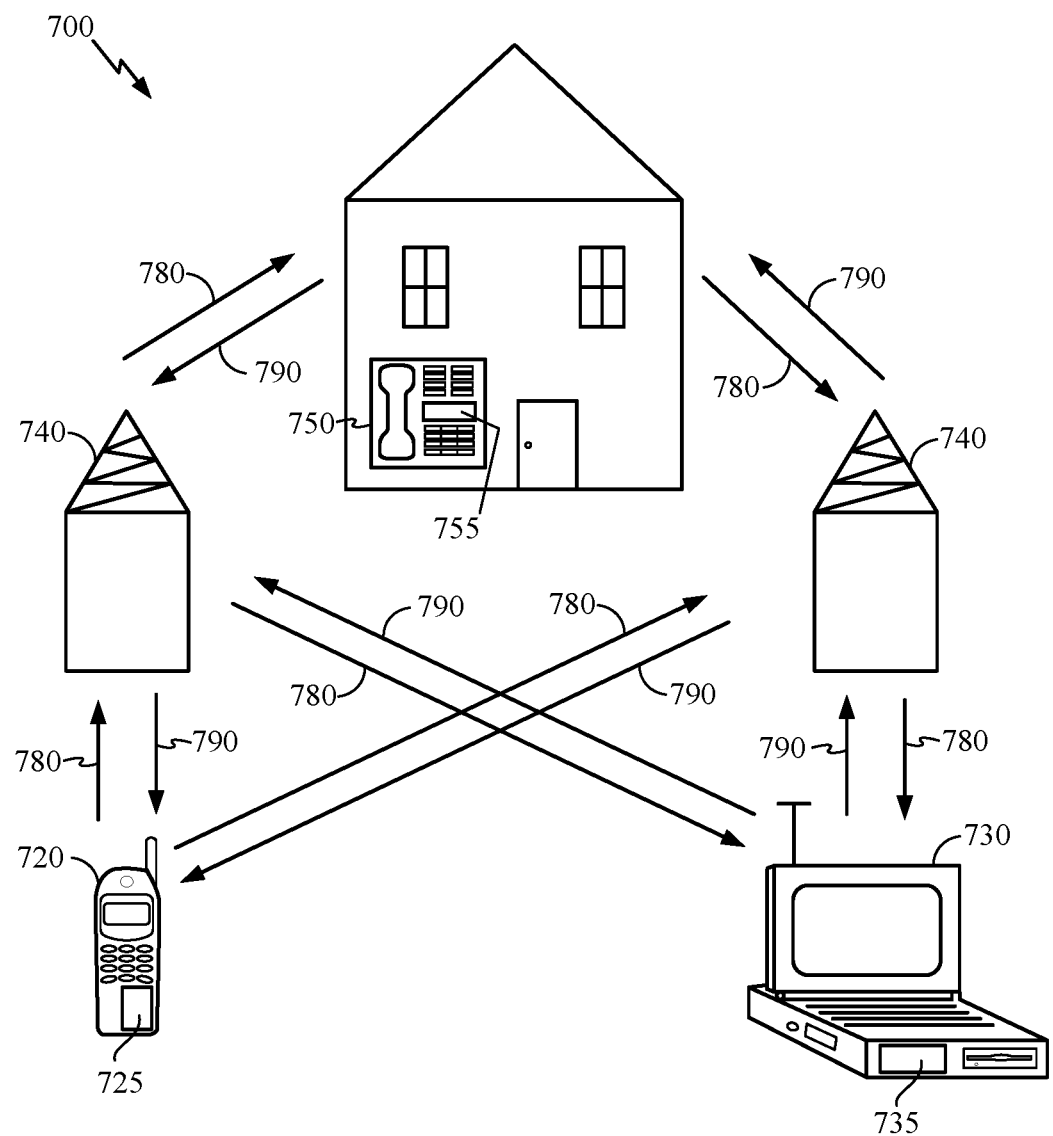
FIG. 7 generally illustrates a block diagram showing an exemplary wireless communication system in which an aspect of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include integrated circuit (IC) devices 725, 735 and 755, as disclosed below. It will be recognized that any device containing an IC may also include semiconductor components having the disclosed features and/or components manufactured by the processes disclosed here, including the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, the remote unit 720 is shown as a mobile telephone, the remote unit 730 is shown as a portable computer, and the remote unit 750 is shown as a fixed location remote unit in a wireless local loop system. For example, the remote units may be a device such as a music player, a video player, an entertainment unit, a navigation device, a communications device, a personal digital assistant (PDA), a fixed location data unit, and a computer. Although FIG. 7 illustrates remote units according to the teachings of the disclosure, the disclosure is not limited to these exemplary illustrated units. The disclosure may be suitably employed in any device which includes semiconductor components, as described below.

The circuits disclosed herein may be included in a device such as a set top box, a music player, a video player, an entertainment unit, a navigation device, a communications device, a personal digital assistant (PDA), a fixed location data unit, or a computer.

Figure 8:
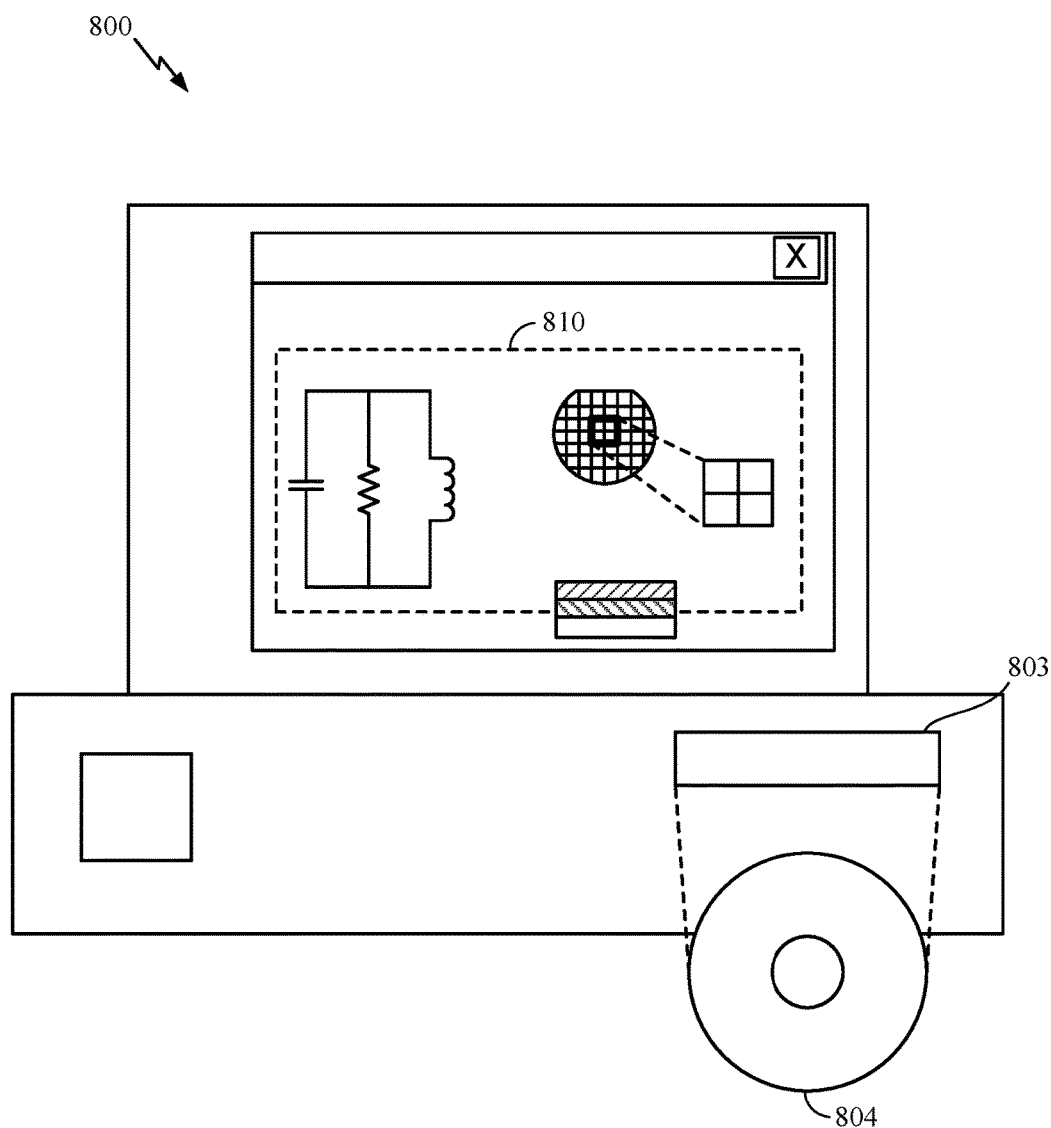
FIG. 8 generally illustrates a block diagram illustrating a design workstation used for circuit, layout, and logic design of the disclosed semiconductor IC package.

FIG. 8 is a block diagram illustrating a design workstation for circuit, layout, and design of a semiconductor part as disclosed herein. A design workstation 800 may include a hard disk containing operating system software, support files, and design software such as Cadence or OrCAD. The design workstation 800 also includes a display to facilitate design of a semiconductor part 810 that may include a circuit and semiconductor dies. A storage medium 804 is provided for tangibly storing the semiconductor part 810. The semiconductor part 810 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from, or writing output to, the storage medium 804.

Data recorded on the storage medium 804 may specify logic circuit configurations, pattern data for photolithography masks, or mask pattern data for serial write tools such as electron beam lithography. Providing data on the storage medium 804 facilitates the design of the semiconductor part 810 by decreasing the number of processes for designing circuits and semiconductor dies.

The foregoing description may have references to discrete elements or properties, such as a capacitor, capacitive, a resistor, resistive, an inductor, inductive, conductor, conductive, and the like. However, it will be appreciated that the various aspects disclosed herein are not limited to specific elements and that various components, elements, or portions of components or elements may be used to achieve the functionality of one or more discrete elements or properties. For example, a capacitive component or capacitive element may be a discrete device or may be formed by a specific arrangement of conductive traces separated by a dielectric material or combinations thereof. Likewise, an inductive component or inductive element may be a discrete device or may be formed by a specific arrangement of conductive traces and materials (e.g., air core, magnetic, paramagnetic, etc.) or combinations thereof. Similarly, a resistive component or resistive element may be a discrete device or may be formed by a semiconductor material, insulating material, adjusting the length and/or cross-sectional area of conductive traces, or combinations thereof. Moreover, a specific arrangement of conductive traces and materials may provide one or more resistive, capacitive, or inductive functions. Accordingly, it will be appreciated that the various components or elements disclosed herein are not limited to the specific aspects and or arrangements detailed, which are provided merely as illustrative examples.

While the foregoing disclosure shows illustrative aspects of the disclosure, it should be noted that various changes and modifications could be made herein without departing from the scope of the invention as defined by the appended claims. The functions, steps and/or actions of the method claims, in accordance with the aspects of the disclosure described herein, need not be performed in any particular order. Furthermore, although elements of the disclosure may be described or claimed in the singular, the plural is contemplated unless limitation to the singular is explicitly stated.

What is claimed is:

1. A circuit apparatus, comprising:
   an insulator having a first surface, a second surface, and a periphery;
   a first subset of circuit elements disposed directly on the first surface, wherein the first subset of circuit elements includes a first inductor and a first capacitor;
   a second subset of circuit elements disposed directly on the second surface, wherein the second subset of circuit elements includes a second inductor and a second capacitor; and
   at least one conductive sidewall disposed on the periphery, wherein the at least one conductive sidewall electrically couples the first subset of circuit elements to the second subset of circuit elements.

2. The circuit apparatus of claim 1, wherein:
   the insulator includes glass; and
   a thickness of the insulator is greater than a thickness of the first subset of circuit elements and greater than a thickness of the second subset of circuit elements.

3. The circuit apparatus of claim 1, wherein the first subset of circuit elements are configured to filter a first frequency band and the second subset of circuit elements are configured to filter a second frequency band, the second frequency band being higher than the first frequency band.

4. The circuit apparatus of claim 1, wherein the second inductor has a lower inductance than the first inductor and the second capacitor has a lower capacitance than the first capacitor.

5. The circuit apparatus of claim 4, wherein the first inductor is a first spiral inductor and the second inductor is a second spiral inductor.

6. The circuit apparatus of claim 4, wherein the circuit apparatus further comprises a first middle insulator on the first surface of the insulator and a second middle insulator on the second surface of the insulator, and wherein:
   the first inductor includes a first inner conductive sublayer in contact with the first middle insulator, a first insulative sublayer in contact with the first inner conductive sublayer, and a first outer conductive sublayer in contact with the first insulative sublayer; and
   the second inductor includes a second inner conductive sublayer in contact with the second middle insulator, a second insulative sublayer in contact with the second inner conductive sublayer, and a second outer conductive sublayer in contact with the second insulative sublayer.

7. The circuit apparatus of claim 4, wherein:
   the first capacitor includes a first inner conductive layer in contact with the first surface of the insulator, a first dielectric layer in contact with the first inner conductive layer, and a first middle conductive layer in contact with the first dielectric layer; and
   the second capacitor includes a second inner conductive layer in contact with the second surface of the insulator, a second dielectric layer in contact with the second inner conductive layer, and a second middle conductive layer in contact with the second dielectric layer.

8. The circuit apparatus of claim 7, wherein the circuit apparatus further comprises a first middle insulator on the first surface of the insulator and a second middle insulator on the second surface of the insulator, the first capacitor being embedded in the first middle insulator and the second capacitor being embedded in the second middle insulator, wherein:
    the first inductor includes a first inner conductive sublayer in contact with the first middle insulator, a first insulative sublayer in contact with the first inner conductive sublayer, and a first outer conductive sublayer in contact with the first insulative sublayer; and
    the second inductor includes a second inner conductive sublayer in contact with the second middle insulator, a second insulative sublayer in contact with the second inner conductive sublayer, and a second outer conductive sublayer in contact with the second insulative sublayer.

9. The circuit apparatus of claim 8, further comprising:
    one or more first vias disposed in the first middle insulator and configured to couple the first inductor to the first capacitor; and
    one or more second vias disposed in the second middle insulator and configured to couple the second inductor to the second capacitor.

10. The circuit apparatus of claim 1, wherein the at least one conductive sidewall includes one or more circuit contact surfaces, the one or more circuit contact surfaces including one or more of:
    a low-frequency band contact surface that is electrically coupled to the first subset of circuit elements;
    a high-frequency band contact surface that is electrically coupled to the second subset of circuit elements; and
    an antenna contact surface that is configured to electrically couple one or more of the first subset of circuit elements and the second subset of circuit elements to an antenna.

11. A method of manufacturing a circuit apparatus, the method comprising:
    providing an insulator having a first surface, a second surface, and a periphery;
    disposing a first subset of circuit elements directly on the first surface, wherein the first subset of circuit elements includes a first inductor and a first capacitor;
    disposing a second subset of circuit elements directly on the second surface, wherein the second subset of circuit elements includes a second inductor and a second capacitor; and
    disposing at least one conductive sidewall on the periphery, wherein the at least one conductive sidewall electrically couples the first subset of circuit elements to the second subset of circuit elements.

12. The method of claim 11, wherein:
    the insulator includes glass; and
    a thickness of the insulator is greater than a thickness of the first subset of circuit elements and greater than a thickness of the second subset of circuit elements.

13. The method of claim 11, wherein the first subset of circuit elements are configured to filter a first frequency band and the second subset of circuit elements are configured to filter a second frequency band, the second frequency band being higher than the first frequency band.

14. The method of claim 11, wherein the second inductor has a lower inductance than the first inductor and the second capacitor has a lower capacitance than the first capacitor.

15. The method of claim 14, wherein:
    disposing the first inductor includes patterning a first spiral pattern and plating a first spiral inductor in accordance with the first spiral pattern; and
    disposing the second inductor includes patterning a second spiral pattern and plating a second spiral inductor in accordance with the second spiral pattern.

16. The method of claim 14, further comprising:
    disposing a first middle insulator on the first surface of the insulator and a second middle insulator on the second surface of the insulator, and wherein:
    disposing the first inductor includes patterning and plating a first inner conductive sublayer in contact with the first middle insulator, a first insulative sublayer in contact with the first inner conductive sublayer, and a first outer conductive sublayer in contact with the first insulative sublayer; and
    disposing the second inductor includes patterning and plating a second inner conductive sublayer in contact with the second middle insulator, a second insulative sublayer in contact with the second inner conductive sublayer, and a second outer conductive sublayer in contact with the second insulative sublayer.

17. The method of claim 14, wherein:
    disposing the first capacitor includes patterning and metallizing a first inner conductive layer in contact with the first surface of the insulator, applying a first dielectric layer in contact with the first inner conductive layer, and patterning and metallizing a first middle conductive layer in contact with the first dielectric layer; and
    disposing the second capacitor includes patterning and metallizing a second inner conductive layer in contact with the second surface of the insulator, applying a second dielectric layer in contact with the second inner conductive layer, and patterning and metallizing a second middle conductive layer in contact with the second dielectric layer.

18. The method of claim 17, further comprising disposing a first middle insulator on the first surface of the insulator and disposing a second middle insulator on the second surface of the insulator, the first capacitor being embedded in the first middle insulator and the second capacitor being embedded in the second middle insulator, wherein:
    disposing the first inductor includes patterning and plating a first inner conductive sublayer in contact with the first middle insulator, applying a first insulative sublayer in contact with the first inner conductive sublayer, and patterning and plating a first outer conductive sublayer in contact with the first insulative sublayer; and
    disposing the second inductor includes patterning and plating a second inner conductive sublayer in contact with the second middle insulator, applying a second insulative sublayer in contact with the second inner conductive sublayer, and patterning and plating a second outer conductive sublayer in contact with the second insulative sublayer.

19. The method of claim 18, further comprising:
    laser patterning one or more first vias into the first middle insulator, the one or more first vias being configured to couple the first inductor to the first capacitor; and
    laser patterning one or more second vias into the second middle insulator, the one or more second vias being configured to couple the second inductor to the second capacitor.

20. The method of claim 11, wherein disposing the at least one conductive sidewall on the periphery includes metallizing the periphery to form one or more circuit contact surfaces, the one or more circuit contact surfaces including one or more of:
    a low-frequency band contact surface that is electrically coupled to the first subset of circuit elements;

a high-frequency band contact surface that is electrically coupled to the second subset of circuit elements; and
an antenna contact surface that is configured to electrically couple one or more of the first subset of circuit elements and the second subset of circuit elements to an antenna.

* * * * *